US 8,735,235 B2

(12) United States Patent
Chuang et al.

(10) Patent No.: US 8,735,235 B2
(45) Date of Patent: May 27, 2014

(54) INTEGRATED CIRCUIT METAL GATE STRUCTURE AND METHOD OF FABRICATION

(75) Inventors: Harry Chuang, Hsin-Chu (TW); Kong-Beng Thei, Hsin-Chu (TW); Chiung-Han Yeh, Tainan (TW); Ming-Yuan Wu, Hsin Chu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 774 days.

(21) Appl. No.: 12/276,015

(22) Filed: Nov. 21, 2008

(65) Prior Publication Data

US 2010/0044783 A1 Feb. 25, 2010

Related U.S. Application Data

(60) Provisional application No. 61/090,469, filed on Aug. 20, 2008.

(51) Int. Cl.
*H01L 21/338* (2006.01)

(52) U.S. Cl.
USPC ............. 438/183; 257/407; 257/E21.444; 257/E21.453

(58) Field of Classification Search
CPC ................................. H01L 29/66545
USPC ......... 438/183, 595, 596, 652, 692, 700, 701; 257/407, 412, E21.444, E21.453
See application file for complete search history.

(56) References Cited

U.S. PATENT DOCUMENTS

| | | | | |
|---|---|---|---|---|
| 5,960,270 A | * | 9/1999 | Misra et al. | 438/197 |
| 6,346,450 B1 | * | 2/2002 | Deleonibus et al. | 438/305 |
| 6,642,590 B1 | | 11/2003 | Besser et al. | |
| 6,974,736 B2 | * | 12/2005 | Ku et al. | 438/197 |
| 7,176,090 B2 | | 2/2007 | Brask et al. | |
| 7,208,361 B2 | | 4/2007 | Shah et al. | |
| 7,303,996 B2 | | 12/2007 | Wang et al. | |
| 7,332,407 B2 | | 2/2008 | Wang et al. | |
| 7,361,565 B2 | * | 4/2008 | Shin et al. | 438/303 |
| 7,517,746 B2 | * | 4/2009 | Lin et al. | 438/197 |

FOREIGN PATENT DOCUMENTS

CN 1319881 10/2001

OTHER PUBLICATIONS

Chinese Patent Office, Office Action dated Dec. 29, 2010, Application No. 200910161763.3, 8 pages.

* cited by examiner

*Primary Examiner* — David Vu
(74) *Attorney, Agent, or Firm* — Haynes and Boone, LLP

(57) ABSTRACT

A method is provided for forming a metal gate using a gate last process. A trench is formed on a substrate. The profile of the trench is modified to provide a first width at the aperture of the trench and a second width at the bottom of the trench. The profile may be formed by including tapered sidewalls. A metal gate may be formed in the trench having a modified profile. Also provided is a semiconductor device including a gate structure having a larger width at the top of the gate than the bottom of the gate.

15 Claims, 11 Drawing Sheets

INTEGRATED CIRCUIT METAL GATE STRUCTURE AND METHOD OF FABRICATION

PRIORITY DATA

This application claims priority to Provisional Application Ser. No. 61/090,469 filed on Aug. 20, 2008, entitled "INTEGRATED CIRCUIT METAL GATE STRUCTURE AND METHOD OF FABRICATION", the entire disclosure of which is incorporated herein by reference.

BACKGROUND

The present disclosure relates generally an integrated circuit device and, more particularly, to a gate structure and method of forming a gate of an integrated circuit device.

Providing metal gate structures (e.g., including a metal gate electrode rather than polysilicon) offers one solution to improving IC device performance as technology nodes decrease. One process of forming a metal gate stack is termed "gate last" process in which the final gate stack is fabricated "last" which allows for reduced number of subsequent processes, including high temperature processing, that must be performed after formation of the gate. The "gate last" process including forming a metal gate in a "trench" left by removal of a dummy gate. Additionally, as the dimensions of transistors decrease, the thickness of the gate oxide must be reduced to maintain performance with the decreased gate length. In order to reduce gate leakage, high dielectric constant (high-k) gate insulator layers are used which allow greater physical thicknesses while maintaining the same effective thickness as would be provided by a typical gate oxide used in larger technology nodes.

There are challenges to implementing such features and processes in MOSFET fabrication however. As the gate lengths decrease, these problems are exacerbated. For example, in a "gate last" fabrication process, voiding can occur when depositing a metal film into a trench to from the metal gate electrode. As gate lengths decrease, the trench also decreases in size, and depositing metal into the trench becomes increasingly difficult, and increasingly likely to form a void.

Therefore, what is needed is an improved gate structure and device and method of gate formation.

SUMMARY

In one embodiment, a method of fabricating a semiconductor device is provided. The method includes providing a substrate including an insulating layer and forming a trench in the insulating layer. The profile of the trench is modified to provide a first width greater than a second width. A metal gate is formed in the trench having the modifying profile. The first width may include a width at the aperture of the trench.

In another embodiment, a semiconductor device is provided. The device includes a substrate, a source and a drain region formed on the substrate; and a gate structure disposed on the substrate between the source and drain regions. The gate structure includes a gate dielectric layer, wherein the gate dielectric includes a high dielectric constant (high K) material. The gate structure also includes a metal gate electrode. The metal gate electrode includes a tapered profile.

A method of semiconductor fabrication is also provided. The method includes providing a semiconductor substrate and forming a dummy gate structure on the substrate. The dummy gate structure includes polysilicon. The dummy gate structure is then removed to provide a trench having a top portion and a bottom portion. The top portion and the bottom portion are of a first width. The method then continues to increase the width of the top portion of the trench to provide a greater width. A gate is then formed in the trench. The forming the gate includes depositing a metal layer into the trench.

DETAILED DESCRIPTION

Figure 1:
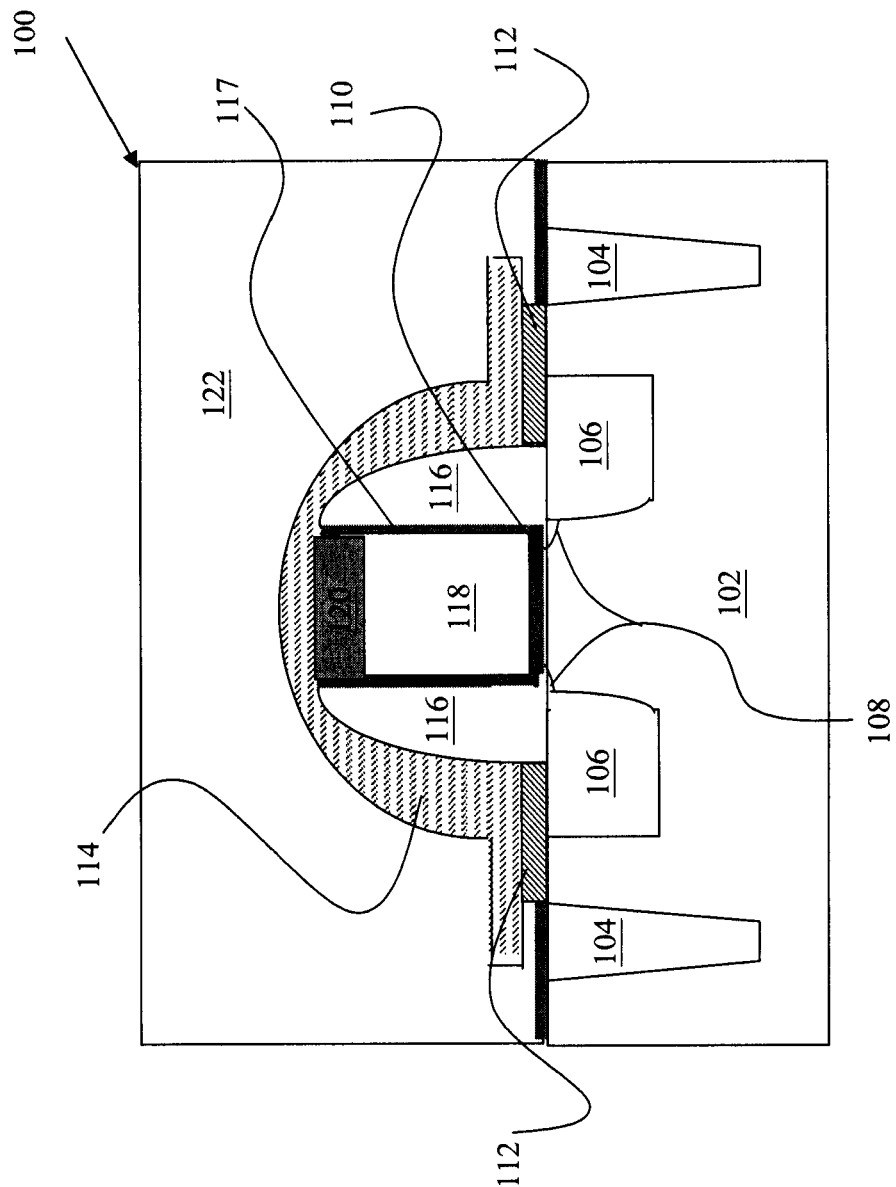
FIGS. 1-3 are cross-sectional views of a semiconductor device a various stages in of fabrication in an embodiment of a gate last process.

The present disclosure relates generally to forming an integrated circuit device on a substrate and, more particularly, to fabricating a gate structure as part of an integrated circuit (including FET devices). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however one skilled in the art may recognize applicability to other processes and/or use of other materials.

Figure 2:
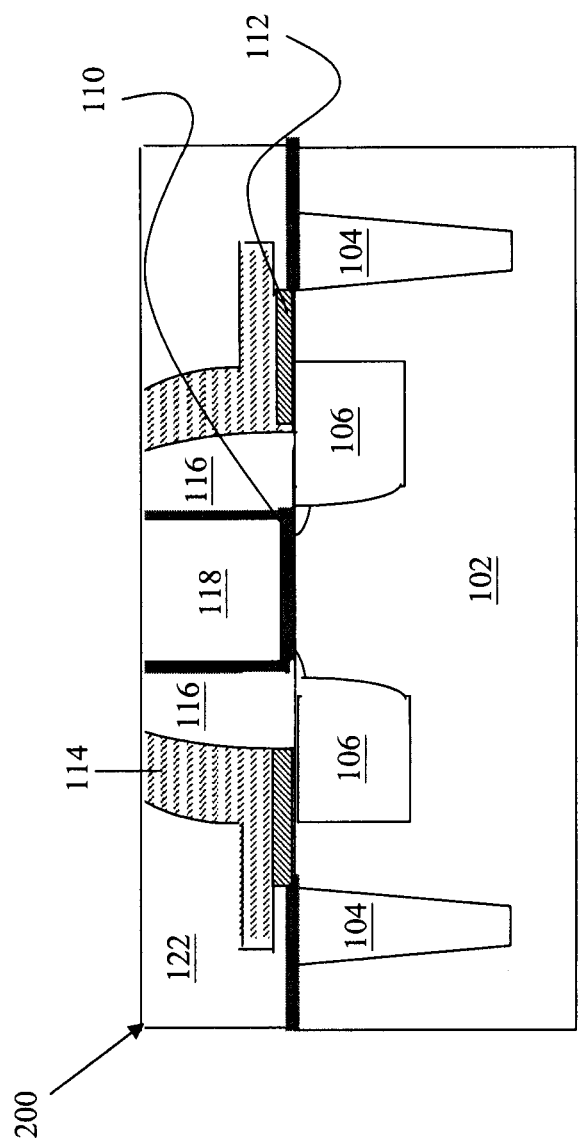
Figure 3:
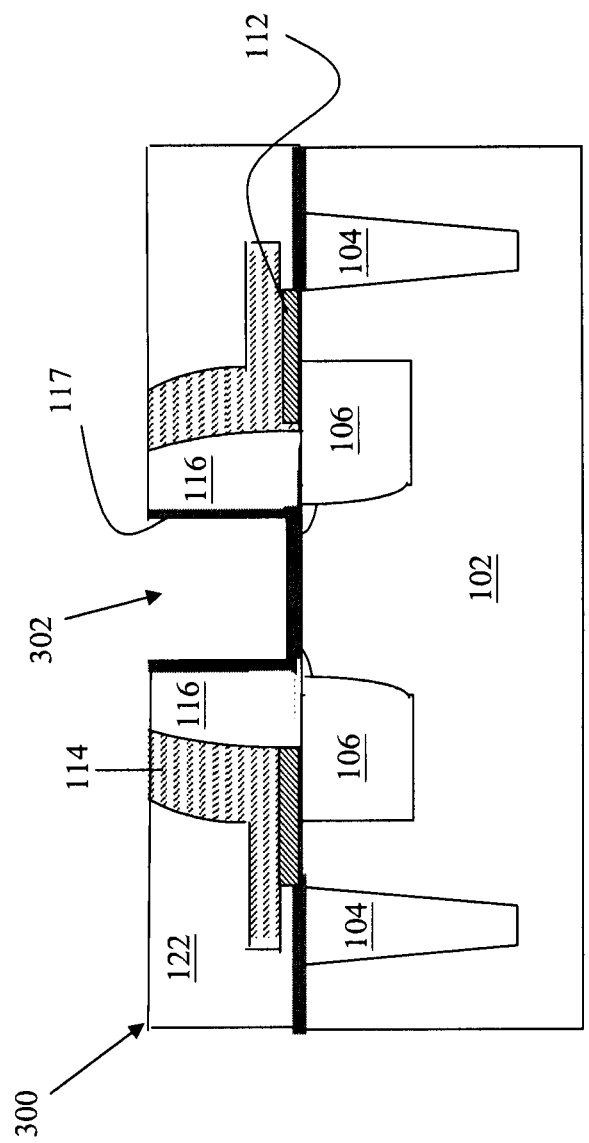

Referring to FIGS. 1, 2, and 3 illustrated are cross-sectional views of a semiconductor device at various stages of fabrication in a gate last process. The various stages of the device are illustrated as device 100, 200, and 300 respectively. One or more features, for example of the device 100, may be included in the devices 200 and 300 and remain substantially unchanged except as noted herein. The devices 100, 200, and 300 may be intermediate devices fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

The semiconductor device 100 includes a substrate 102. Formed on the substrate 102 are shallow trench isolation (STI) structures 104, source/drain regions 106 (including source/drain extension regions 108), a gate dielectric 110, contacts 112, a contact etch stop layer (CESL) 114, spacers 116, a dummy gate pattern 118, hard mask layer 120, and a dielectric layer 122.

In an embodiment, the substrate 102 includes a silicon substrate (e.g., wafer) in crystalline structure. The substrate 102 may include various doping configurations depending on design requirements as is known in the art (e.g., p-type substrate or n-type substrate). Other examples of the substrate 102 may also include other elementary semiconductors such as germanium and diamond. Alternatively, the substrate 102 may include a compound semiconductor such as, silicon carbide, gallium arsenide, indium arsenide, or indium phosphide. Further, the substrate 102 may optionally include an epitaxial layer (epi layer), may be strained for performance enhancement, and/or may include a silicon-on-insulator (SOI) structure.

The shallow trench isolation (STI) features 104 formed in the substrate 102 may isolate one or more devices from each other. The STI features 104 may include silicon oxide, silicon nitride, silicon oxynitride, fluoride-doped silicate glass (FSG), and/or a low k dielectric material. Other isolation methods and/or features are possible in lieu of or in addition to STI. The STI features 104 may be formed using processes such as reactive ion etch (RIE) of the substrate 102 to form trenches which are then filled with insulator material using deposition processes followed by CMP process.

The gate structure formed using the dummy gate pattern 118 may be configured as P-channel or N-channel as is known in the art. The dummy gate pattern 118 is a sacrificial layer. The dummy gate pattern 118 may include polysilicon. In an embodiment, the dummy gate pattern 118 includes amorphous silicon. The dummy gate pattern 118 may be formed by MOS technology processing such as polysilicon deposition, photolithography, etching, and/or other suitable methods. The gate dielectric 110 may include a high dielectric constant (HK) material. In an embodiment, the HK-dielectric material includes hafnium oxide ($HfO_2$). Other examples of HK dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The semiconductor device 100 may further include, various other dielectric and/or conductive layers, for example, interfacial layers and/or capping layers underlying the dummy gate pattern 118.

The spacers 116 may be formed on both sidewalls of the dummy gate structure 118. The spacers 116 may be formed of silicon oxide, silicon nitride, silicon oxynitride, silicon carbide, fluoride-doped silicate glass (FSG), a low k dielectric material, combinations thereof, and/or other suitable material. The spacers 116 may have a multiple layer structure, for example, including one or more liner layers such as liner layer 117. The liner layer 117 may include a dielectric material such as silicon oxide, silicon nitride, and/or other suitable materials. The spacers 116 may be formed by methods including deposition of suitable dielectric material and anisotropically etching the material to form the spacer 116 profile.

The hard mask layer 120 may include silicon nitride, silicon oxynitride, silicon carbide, and/or other suitable materials. The hard mask layer 120 may be formed using methods such as chemical vapor deposition (CVD), physical vapor deposition (PVD), atomic layer deposition (ALD), and/or other suitable processes. In an embodiment, the hard mask layer 120 is between approximately 100 and 500 angstroms in thickness.

The source/drain regions 106 including lightly doped source/drain regions and heavy doped source/drain regions illustrated as regions 108, are formed on the substrate 102. The source/drain regions 106 may be formed by implanting p-type or n-type dopants or impurities into the substrate 102 depending on the desired transistor configuration. The source/drain features 106 may be formed by methods including photolithography, ion implantation, diffusion, and/or other suitable processes. In an embodiment, the source and drain are formed prior to the gate dielectric 110. The contact features 112, coupled to the source/drain regions 106, may include silicide. The contact features 112 may be formed on the source/drain regions 106 by a salicide (self-aligned silicide) process. The contacts 112 may include nickel silicide, cobalt silicide, tungsten silicide, tantalum silicide, titanium silicide, platinum silicide, erbium silicide, palladium silicide, or combinations thereof. The contact etch stop layer (CESL) 114 may be formed of silicon nitride, silicon oxynitride, and/or other suitable materials. The CESL 114 composition may be selected based upon etching selectivity to one or more additional features of the semiconductor device 100.

A dielectric layer 122 such as an inter-layer (or level) dielectric (ILD) layer may be formed overlying the CESL 114 by chemical vapor deposition (CVD), high density plasma CVD, spin-on, sputtering, or other suitable methods. The dielectric layer 122 may include silicon oxide, silicon oxynitride, or a low k material. In an embodiment, the dielectric layer 122 is a high density plasma (HDP) dielectric. Other layers may be present on the device 100 including capping layers, metal layers, interfacial layers, interconnect layers and/or vias, etc. In an embodiment, a capping layer is formed on the gate dielectric layer. The capping layer may adjust the work function of the subsequently formed metal gate. In an embodiment, a metal layer is formed on the gate dielectric layer. The overlying metal layer may adjust the work function of the subsequently formed gate. The capping layer may include metal (La, Mg), metal oxide (LaOx, MgOx), metal alloyed oxide (BaTiOx, SrTiOx, PbZrTiOx), a combination thereof, and/or other suitable materials.

In a gate last process, the dummy gate structure 118 may be removed so that a resulting metal gate structures may be formed in place of the dummy gate structure 118. Accordingly, the dielectric layer 122 may be planarized by a chemical mechanical polishing (CMP) process until a top portion of the dummy gate structure 118 is reached as illustrated by the device 200 of FIG. 2. Following the planarization, the dummy gate structure 118 may be removed, providing the device 300 of FIG. 3. For example, polysilicon is selectively etched removing the dummy gate structure 118. The selective removal of the dummy gate structure 118 provides a trench 302 within which a metal gate may be formed. The dummy gate structure 118 may be removed using a wet etch and/or a dry etch. In an embodiment, a wet etch process includes exposure to a hydroxide containing solution (e.g., ammonium hydroxide), deionized water, and/or other suitable etchant solutions.

Figure 4:
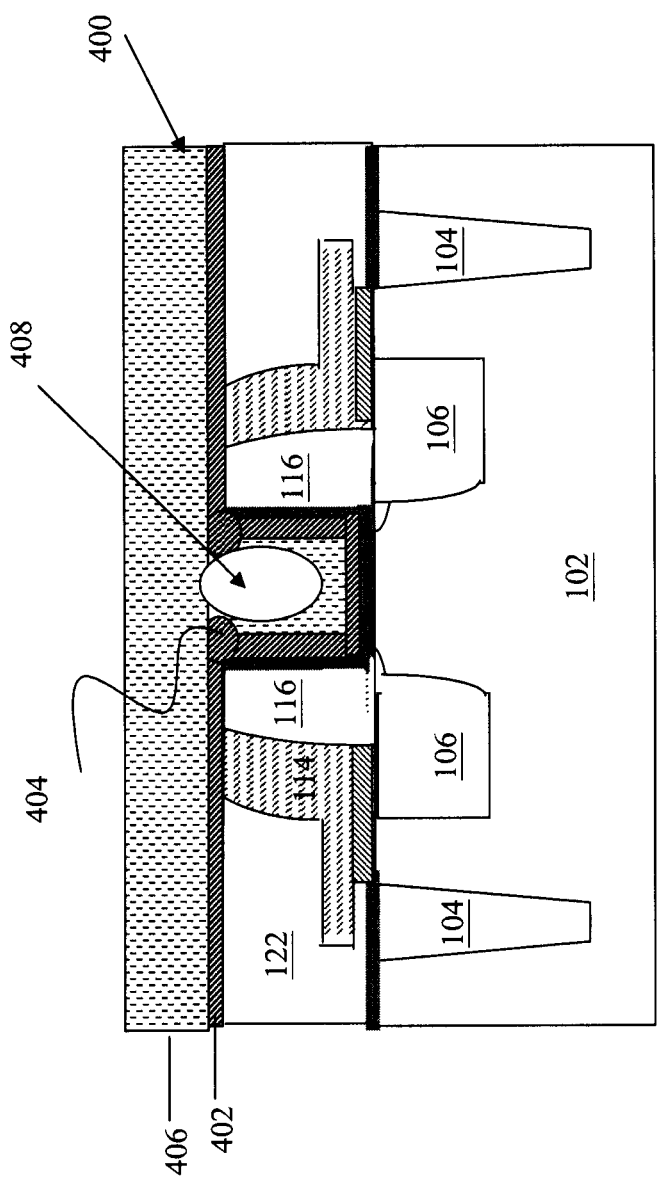
FIGS. 4 and 5 are cross-sectional views of a semiconductor device during metal deposition processes of an embodiment of a gate last process
Figure 5:
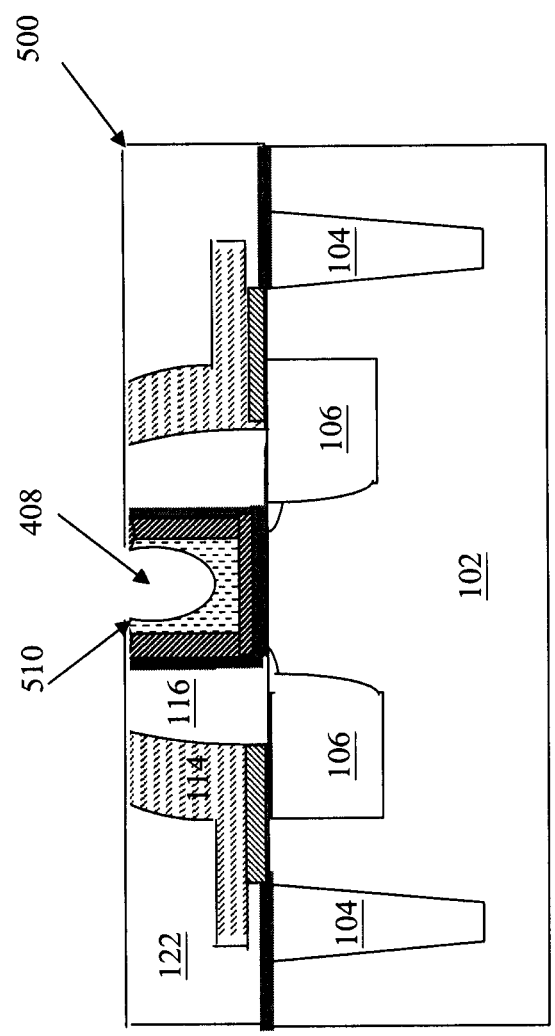

Referring now to FIGS. 4 and 5, an embodiment of formation of a metal gate is illustrated. FIG. 4 illustrates a device 400 including metal gate materials deposited into the trench 300. The metal gate materials may include one or more layers of material such as, liners, materials to provide appropriate work function of the gate, gate electrode materials, and/or other suitable materials. However, it has been observed that deposition of one or more layers required for the metal gate formation may provide incomplete filling of the trench 300. For example, a deposition of a first metal 402 such as a metal liner and/or work function metal may provide an overhang 404 at the aperture of the trench 300. The overhang 404 may result from the difficulties in filling a high aspect ratio trench.

The subsequent deposition of metal layer 406 may form one or more voids such as, void 408, in the trench.

Referring now to FIG. 5, a chemical mechanical polish (CMP) process is performed on the device 400 to provide the device 500 and form the metal gate 502. The device 500 illustrates the metal gate 502 formed with the void 408. Though further CMP processing may reduce the void 408, for example, by reducing the gate height, this may cause other issues such as decrease of stress on the channel (e.g., disadvantageous reduction of stress for a strained device) and/or the performance of the transistor may be degraded.

Therefore, FIGS. 4 and 5 illustrate disadvantages of a gate last process where the aspect ratio of a resultant trench provides for difficult deposition of material to partially or completely fill the trench.

Figure 6:
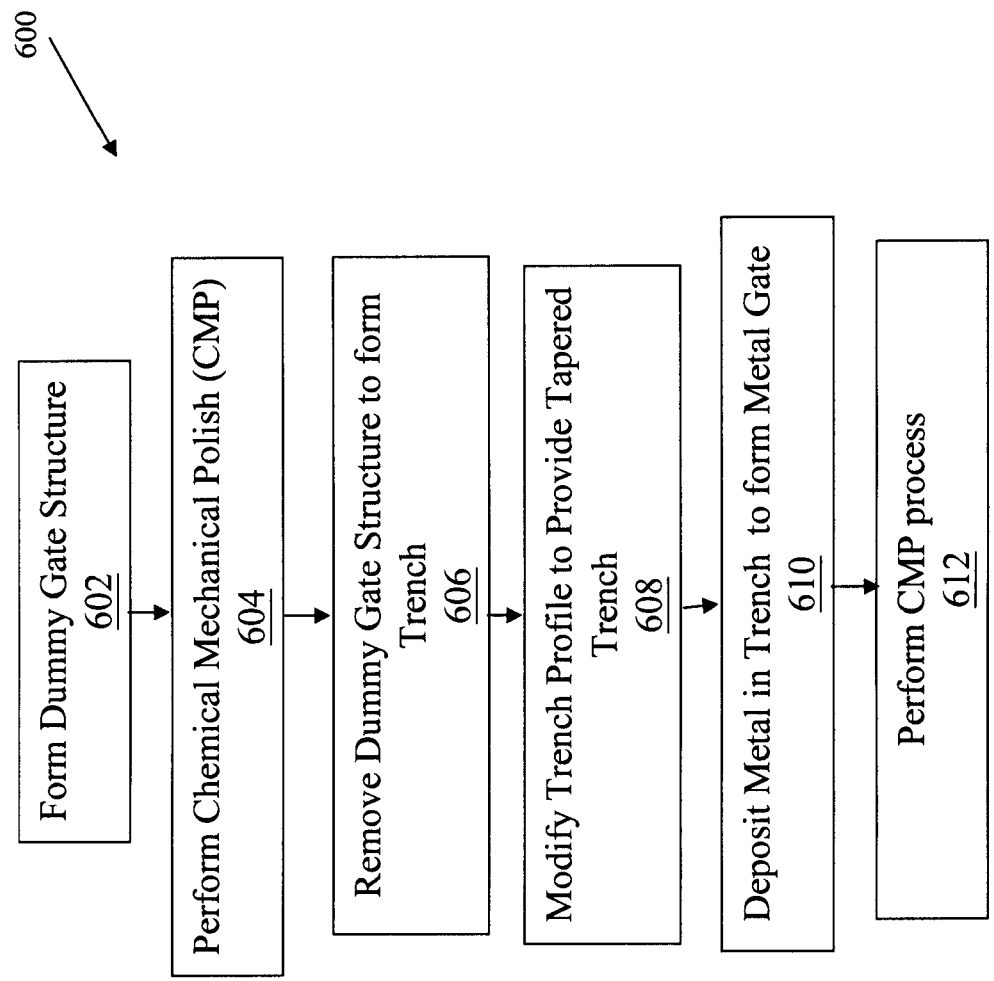
FIG. 6 is a flowchart of an embodiment of a method of forming a gate including a gate last process.

Referring now to FIG. 6, illustrated is a method 600 including the formation of a metal gate by a "gate last" process. The method 600 begins at step 602 where a device including a transistor structure is formed. The transistor structure includes a dummy gate structure. The dummy gate structure may include a dummy polysilicon gate structure. The device formed may be substantially similar to the device 100, described above with reference to FIG. 1. In particular, the dummy gate structure may be substantially similar to the dummy gate structure 118 described above with reference to FIG. 1.

The method 600 then proceeds to step 604 where a chemical mechanical polish (CMP) process is performed. The CMP process may planarize the device and expose the dummy gate structure. The resultant device may be substantially similar to the device 200, illustrated above with reference to FIG. 2.

The method 600 then proceeds step 606 where the dummy gate structure is removed. The removal of the dummy gate structure may provide for a trench (e.g., aperture in the substrate) within which a metal gate may be formed. The resultant device may be substantially similar to the device 300, illustrated above with reference to FIG. 3. In particular, the trench may be substantially similar to the trench 302, described above with reference to FIG. 3. The sidewalls and bottom of the trench may be coated with a liner layer. In an embodiment, the liner layer may be $SiO_2$, SiN, and/or other suitable material. The liner layer may be included in a spacer feature. The liner layer may be substantially similar to the liner 117, described above with reference to FIG. 1.

The method 600 then proceeds to step 608 where the profile of the trench formed in step 606 is modified. The profile may be modified such that the opening of the trench (e.g., top portion or aperture of the trench) is wider than the bottom of the trench. The profile may be modified using a sputtering process, reactive ion etch, and/or other suitable processes capable of removal of portions of the adjacent layers. The sputtering process may be performed by a physical vapor deposition (PVD) tool. The sputtering process may use inert ions such as argon. In an embodiment, the profile is modified using an inert gas containing plasma. In an embodiment, a sputtering process is used which includes an inert gas (e.g., argon) at room temperature. In an embodiment, the sputtering process is a multiple step process. For example, the RF power of a first sputtering process may be between approximately 200 and 3000 Watts, which is then decreased for a second sputtering process including an RF power between approximately 300 and 400 Watts. The dual stage process may provide in the first step a 'rough' removal a portion of the surrounding layer(s) (e.g., dielectric), and the second step may fine-tune the trench profile.

Figure 7:
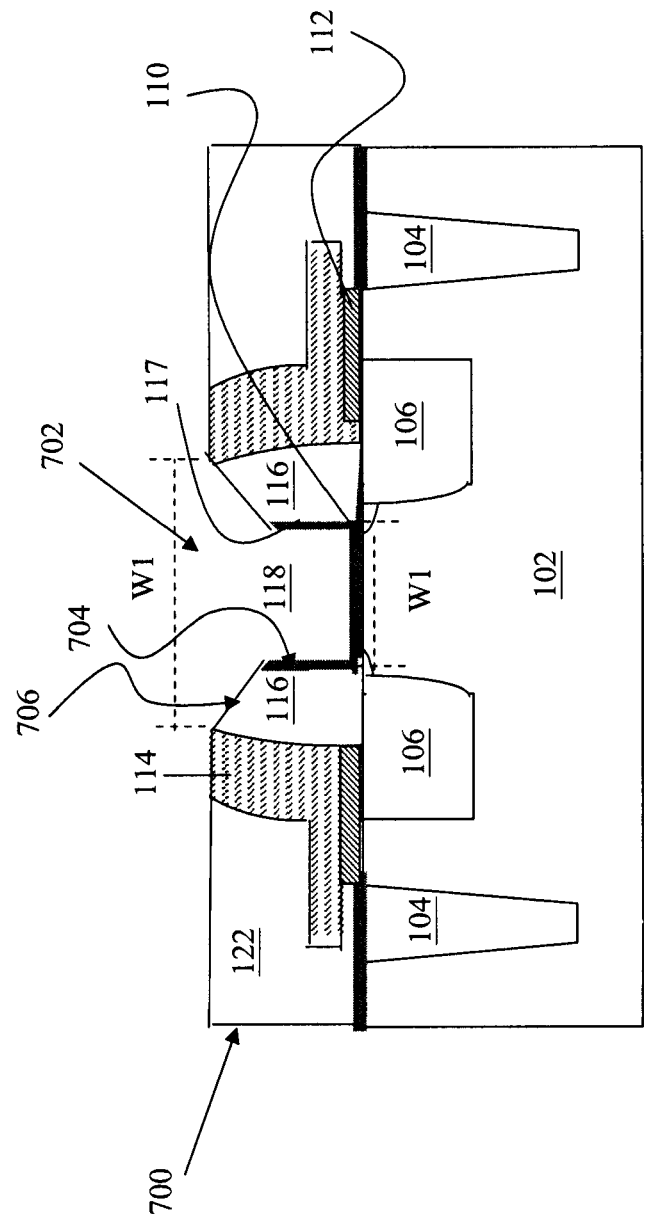
FIGS. 7, 8, and 9 are cross-sectional views of a semiconductor device of an embodiment of the gate last process of FIG. 6.

The modified profile includes tapered sidewalls of the trench. Referring the example of FIG. 7, a modified profile trench 702 is provided. The modified profile trench 702 may be referred to as a tapered profile trench. The trench 702 includes a width at its aperture W1 that is greater than the width at the bottom of the trench W2. The sidewalls of the trench, such as sidewall 704 extend vertically from the bottom of the trench, and then extend in an oblique manner to form the top of the trench illustrated by oblique sidewall 706. Other embodiments of modified profiles are possible that include a greater width at an opening that at a bottom of a trench.

Figure 8:
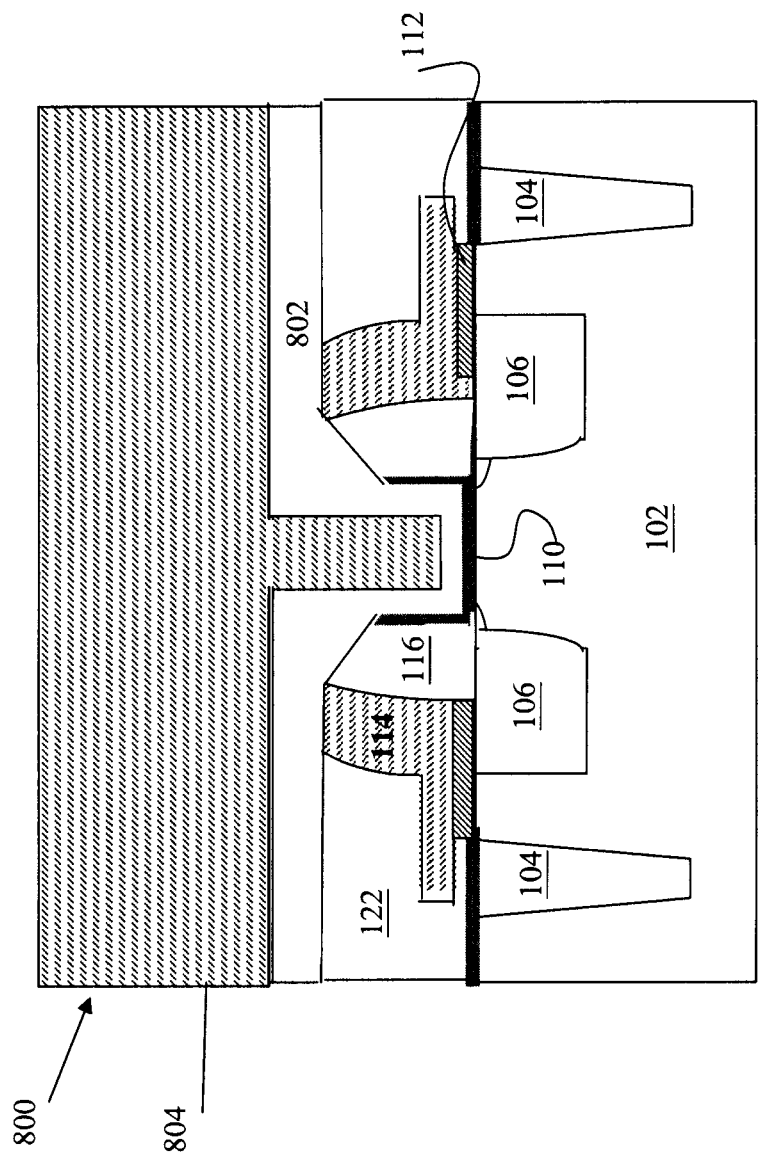

The method 600 then proceeds step 610 where metal is deposited in the modified profile trench. The metal deposited may be any metal material suitable for forming a metal gate or portion thereof, including work function layers, liner layers, interface layers, seed layers, adhesion layers, barrier layers, etc. The metal gate may include one or more layers including Ti, TiN, TaN, Ta, TaC, TaSiN, W, WN, MoN, MoON, $RuO_2$, and/or other suitable materials. The metal gate may include one or more layers formed by PVD, CVD, ALD, plating, and/or other suitable processes. Examples of metals that may be deposited include p-type metal materials and n-type metal materials. P-type metal materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials. In addition to the n-type and/or p-type metals, a fill metal may be deposited to substantially or completely fill the remainder of the trench. The fill metal may include titanium nitride, tungsten, titanium, aluminum, tantalum, tantalum nitride, cobalt, copper, nickel, and/or other suitable materials. The fill metal may be deposited using CVD, PVD, plating, and/or other suitable processes. Referring to the example of FIG. 8, a work function metal 802 and a metal gate fill material 804 are deposited. The deposited layers substantially fill the trench provided above in steps 606 and 608. It is noted that a first deposited layer (e.g., work function metal 802) provides a vertical sidewall (in comparison with the overhang 404 described above with reference to FIGS. 4 and 5).

Figure 9:
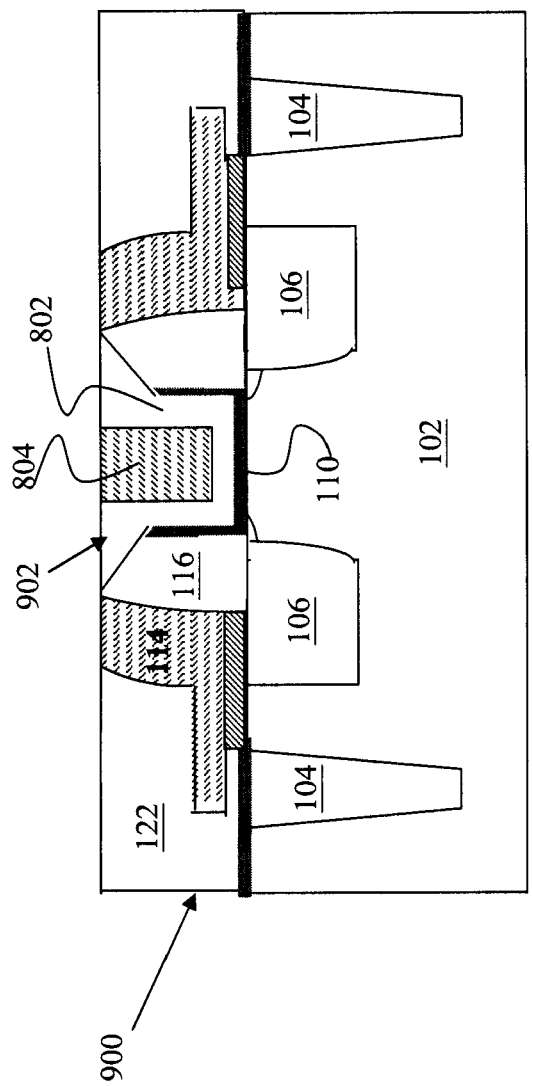

The method 600 then proceeds to step 612 where a chemical mechanical polish (CMP) process is performed. The CMP process planarizes the device. The planarization may remove materials deposited outside of the trench structure. Referring to the example of FIG. 9, a planarization process provides the device 900 including a metal gate structure 902. The metal gate structure 902 may be substantially free of voids. The metal gate structure 902 includes the work function metal 802, the metal gate fill material 804 and the gate dielectric layer 110. The metal gate electrode structure has a modified profile. In particular, the metal gate structure 902 includes a tapered profile as illustrated by the top of the gate being wider than the bottom of the gate. (Note that top and bottom are relative terms and not intended to provide any absolute directional limitation).

In embodiments, the method 600 may continue to include process steps such as deposition of capping layer, formation of contacts, interconnect structures (e.g., lines and vias providing electrical interconnection to the device including the formed metal gate).

Thus, the method 600 and the devices illustrated in FIGS. 1-3 and 7-9 may provide for improved formation of the metal gate for example, including minimizing and/or eliminating the formation of voids such as provided by the devices 400 and 500 illustrated if FIGS. 4 and 5 respectively. The reduction of voids may be provided by a modification of the profile of the trench in which the gate is formed. This modification may allow for easier deposition (e.g., by CVD, plating, and/or other suitable methods) of material into the trench. The metal gate formed includes a modified profile—a tapered profile metal gate.

Figure 10:
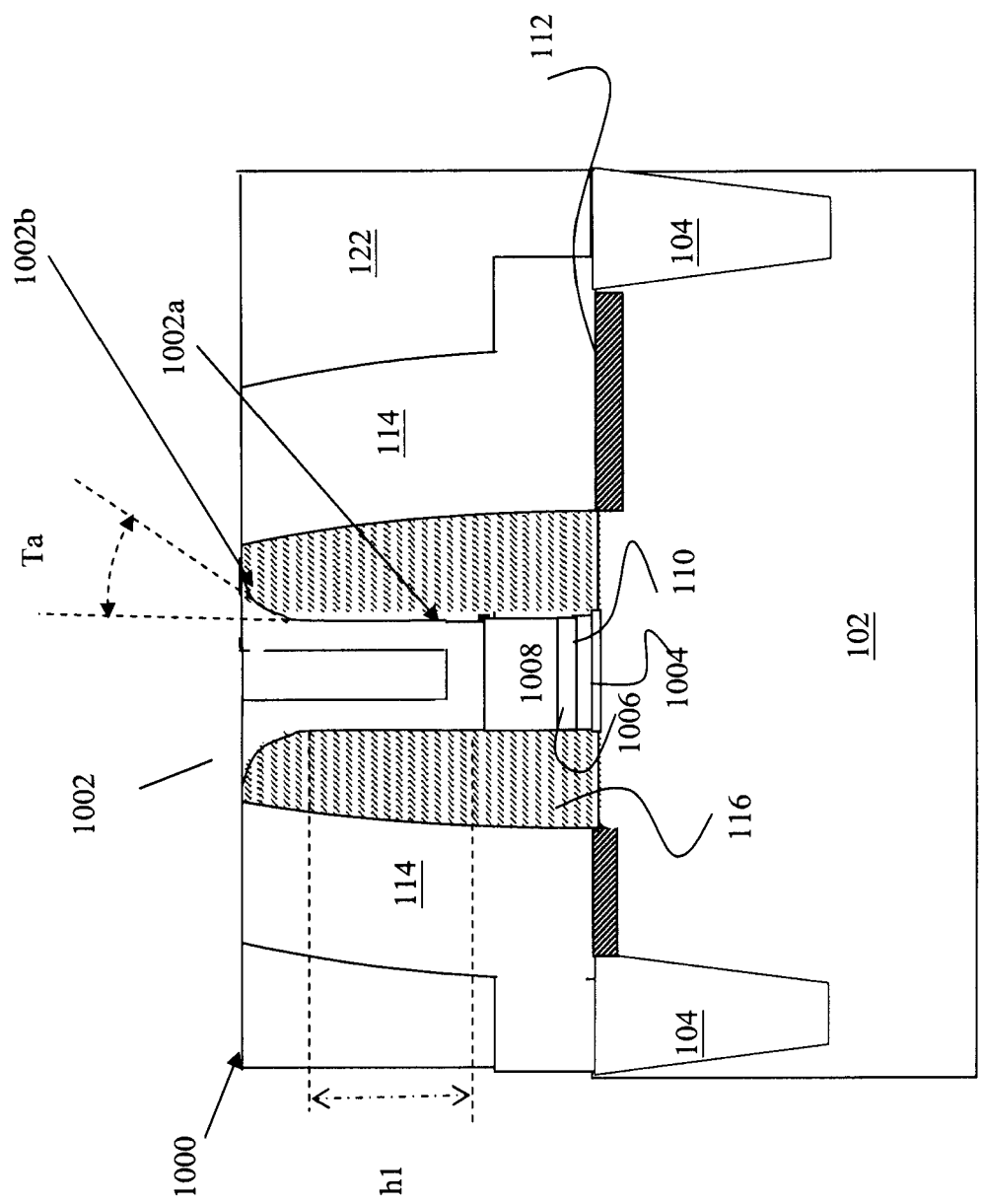
FIGS. 10 and 11 are each cross-sectional views of a semiconductor device including a modified trench profile according to various aspects of the present disclosure.

Referring now to FIG. 10, illustrated is an embodiment of a device 1000 including a metal gate 1002 having a tapered profile. The device 1000 may be formed using the method 600, or portion thereof. The device 1000 includes a substrate 102, STI features 104, contacts 112, spacers 116, a gate dielectric 110, and a dielectric layer 122 that may be substantially similar to the respective features described above with reference to FIG. 1. The device 1000 also includes an interface layer 1004, a capping layer 1006, and a conductive layer 1008. The capping layer 1006 may include metal oxide or metal alloy oxide. In an embodiment the capping layer 1106 may adjust the work function of the gate. The conductive layer 1008 may include metal nitride, $RuO_2$, Ti, Ta, and/or other suitable metals. In other embodiments, additional layers may be present and/or one or more of the described layers may be omitted. The interfacial layer 1004 may include silicon, oxygen, and/or nitrogen.

The device 1000 is illustrative of a tapered profile metal gate structure. The device 1000 includes a metal gate 1002 formed within the tapered profile trench. The metal gate having a tapered profile includes tapered sidewalls that provide a greater width at the top of the gate 1002 than the bottom of the gate 1002 (e.g., nearer the substrate). The sidewalls include a substantially vertical portion 1002a for a distance h1 of the gate electrode. The substantially vertical portion 1002a has an angle of approximately 90 degrees with reference to the surface of the substrate 102. In an embodiment, the vertical portion 1002a has an angle between approximately 85 and 90 degrees relative to the surface of the substrate 102. The sidewalls also include a substantially oblique portion 1002b at the upper portion of the trench, the sidewalls 1002b of the device 1100 being curved (rounded or arcuate). The tapered profile provides a taper having an angle Ta (e.g., taken from the vertical sidewall to an imaginary line drawn tangential to the curved sidewall). In an embodiment the angle Ta is approximately 30 degrees. In an embodiment, the angle Ta is between approximately 20 degrees and 5 degrees. Though described herein as dimensions and features of a gate, the same may apply in describing a tapered profile trench, for example the trench 702, described above with reference to FIG. 7, in which a metal gate is to be formed. For example, the angle Ta may provide the taper angle of a trench formed on the substrate 102, the sidewalls 1002a and/or 1002b, may define the sidewalls of trench as well as or in lieu of a gate.

Figure 11:
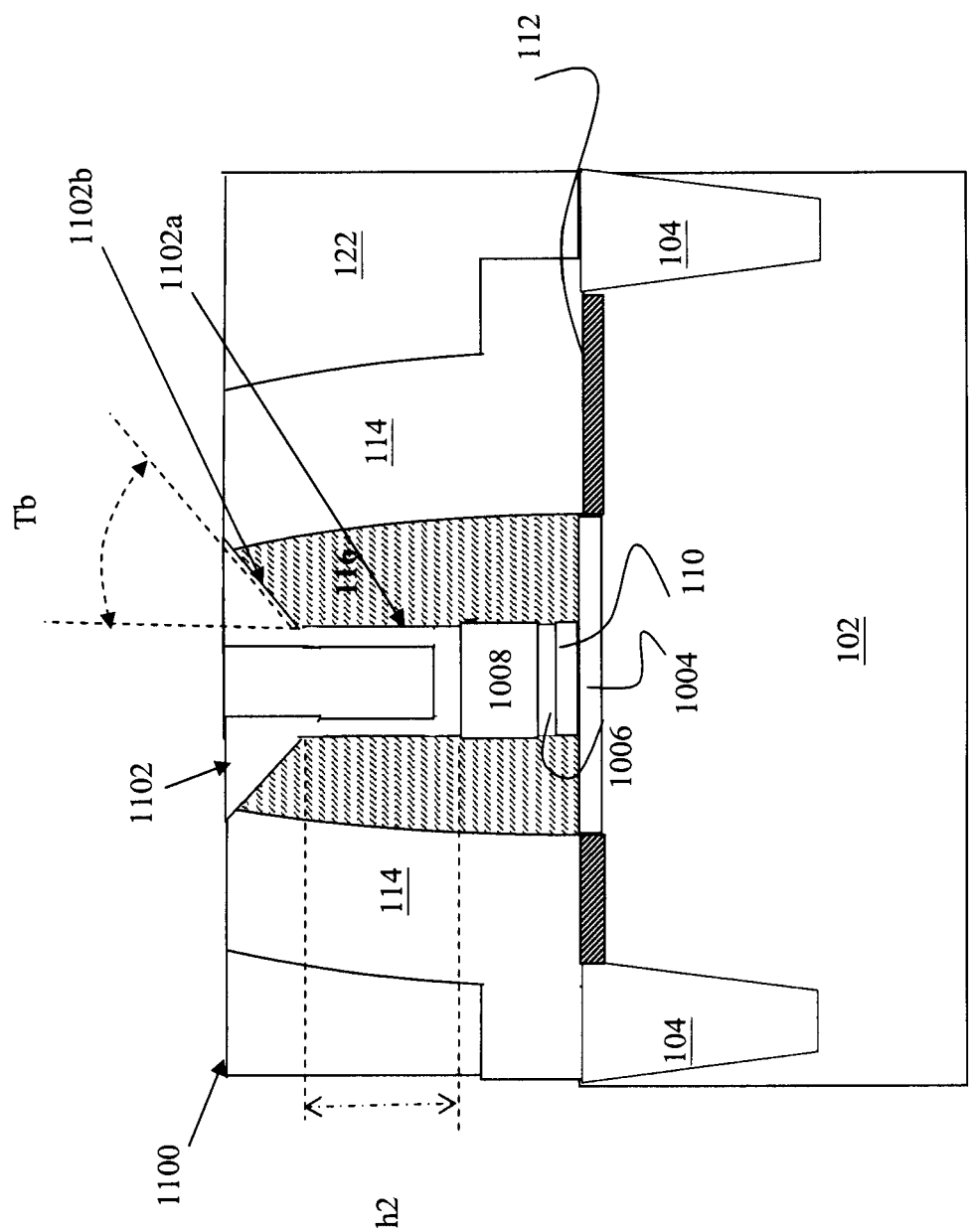

Referring now to FIG. 11, illustrated is an embodiment of a device 1200 including a metal gate. The device 1100 may be formed using the method 600, or portion thereof.

The device 1100 is includes a metal gate 1102 having a tapered profile. The tapered profile metal gate includes tapered sidewalls that provide a greater width at the top of the metal gate than at the bottom (e.g., decreased width nearest the substrate 102). The sidewalls of the gate 1102 include a substantially vertical portion 1102a for a distance h1. The substantially vertical portion 1102a has an angle of approximately 90 degrees with reference to the surface of the substrate 102. In an embodiment, the vertical portion 1102a has an angle between approximately 85 and 90 degrees relative to the surface of the substrate 102. The sidewalls also include an upper portion 1102b that are oblique and extend to the top of the gate 1102, the upper portion of the sidewalls 1102b of the device 1100 are substantially linear (straight). The tapered profile provides a taper having an angle Tb (e.g., angle between the vertical portion 1202a and the tapered portion 1202b). In an embodiment the angle Tb is approximately 30 degrees. In an embodiment, the angle Tb is between approximately 30 degrees and 5 degrees. In an embodiment, the angle Tb is between approximately 5 and 20 degrees. Though described herein as dimensions and features of a gate, the same may apply in describing a tapered profile trench, for example the trench 702, described above with reference to FIG. 7, in which a metal gate is to be formed. For example, the angle Tb may provide the taper angle of a trench formed on the substrate 102, the sidewalls 1102a and/or 1102b, may define the sidewalls of trench as well as or in lieu of a gate.

In summary, a gate last process may be implemented to form metal gate structures. Problems with forming the metal gate structure may be reduced by modifying the aperture (e.g., top opening) of the trench in which the metal gate structure is formed. In particular, the profile of a trench may be modified to provide easier deposition of materials into the trench. The profile can be modified to provide an opening to the trench with an increased width as compared to the width of the remaining trench, including the width at the bottom of the trench. Thus, a gate structure is formed that includes a tapered profile.

Accordingly, the present disclosure provides a device and method that includes a modified trench structure that prevents or reduces the risk of incomplete formation of a metal gate in a gate-last process. While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a semiconductor device, comprising:
    providing a substrate including an insulating layer, a dummy gate structure, spacer elements adjacent the dummy gate structure, and a contact etch stop layer (CESL) surrounding the spacer elements and dummy gate structure;
    forming a trench in the insulating layer, wherein the trench has a first width and is formed by removing the dummy gate structure;
    modifying the profile of the trench after removing the dummy gate structure by removing a portion of the spacer elements without removing the CESL, wherein the modifying includes providing a first portion of the trench with a second width, and a second portion of the trench with the first width, the second width being greater than the first width and wherein the modified trench includes a sidewall having an upper portion that is oblique to and contiguous with a lower portion of the sidewall, the lower portion being substantially perpendicular the substrate; and
    forming a metal gate in the trench having the modified profile.

2. The method of claim 1, wherein the modifying the profile of the trench includes a sputtering process.

3. The method of claim 1, wherein the modifying the profile of the trench includes a plasma process containing an inert gas.

4. The method of claim 1, wherein the modifying the profile of the trench includes a sputtering process containing argon.

5. The method of claim 1, further comprising:
    forming a high-k dielectric layer, wherein the metal gate is formed above the high-k dielectric layer.

6. The method of claim 1, wherein the upper portion is substantially linear.

7. The method of claim 1, wherein the upper portion is curved.

8. The method of claim 1, wherein the forming the trench includes removing dielectric material from the substrate.

9. A method of semiconductor fabrication, comprising:
providing a semiconductor substrate;
forming a dummy gate structure on the substrate, wherein the dummy gate structure includes polysilicon;
forming a spacer on the substrate adjacent the dummy gate structure;
forming a contact etch stop layer (CESL) surrounding the dummy gate structure and the spacer;
removing the dummy gate structure to form a trench having a top portion and a bottom portion, wherein the top portion and the bottom portion are of a first width;
increasing the width of the top portion of the trench to provide a second width after removing the dummy gate structure, wherein the increasing the width includes etching a portion of the spacer and providing substantially no etching of the CESL, and wherein the increasing the width provides a modified trench including a sidewall having an upper portion that is oblique to and is directly connected to a lower portion of the sidewall, the lower portion being substantially perpendicular the substrate; and
forming a gate in the trench including the second width, wherein the forming the gate includes depositing a first metal layer into the trench.

10. The method of claim 9, wherein the first metal layer includes nitrogen, carbon, or combination thereof.

11. The method of claim 9, wherein the increasing the width of the top portion of the trench includes a sputtering process, a reactive ion etch process, a plasma etch process, or a combination thereof.

12. The method of claim 9, further comprising:
forming a high dielectric constant (high k) gate dielectric layer on the substrate underlying the dummy gate structure.

13. A method, comprising:
providing a semiconductor substrate having a dummy gate formed thereon;
forming a contact etch stop layer (CESL) on the semiconductor substrate including surrounding the dummy gate structure, wherein the CESL has a top surface;
forming an interlayer dielectric (ILD) layer on and around the CESL, wherein the ILD layer has a top surface substantially coplanar with the top surface of the CESL;
forming a trench by removing the dummy gate, wherein the trench has sidewalls substantially perpendicular to the semiconductor substrate;
etching a top portion of the sidewalls of the trench, wherein the etching provides an etched trench having a first portion and a second portion, wherein the first portion has a greater width than the second portion, and wherein the first portion and the second portion sidewalls are contiguous, wherein after the etching surface the top surface of the CESL remains substantially co-planar the top surface of the ILD layer; and
forming a gate in the etched trench.

14. The method of claim 13, wherein the etching the top portion of the trench includes a sputtering process, a reactive ion etch process, a plasma etch process, or a combination thereof.

15. The method of claim 13, wherein the second portion of the etched trench has sidewalls substantially perpendicular to the semiconductor substrate.

\* \* \* \* \*